United States Patent
Fassett et al.

(10) Patent No.: US 8,796,865 B1
(45) Date of Patent: Aug. 5, 2014

(54) RFID TAGS WITH BUMPED SUBSTRATE, AND APPARATUSES AND METHODS FOR MAKING

(71) Applicant: Impinj, Inc., Seattle, WA (US)

(72) Inventors: Jay M. Fassett, Edmonds, WA (US); Ronald A. Oliver, Seattle, WA (US); Ronald L. Koepp, Snoqualmie, WA (US); Steven I. Mozsgai, Fallbrook, CA (US); Ernest Allen, III, Portland, OR (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 14/083,244

(22) Filed: Nov. 18, 2013

Related U.S. Application Data

(63) Continuation of application No. 12/238,349, filed on Sep. 25, 2008, now Pat. No. 8,614,506.

(60) Provisional application No. 60/997,493, filed on Oct. 3, 2007.

(51) Int. Cl.
*H01L 23/48* (2006.01)

(52) U.S. Cl.
USPC .......................................................... 257/781

(58) Field of Classification Search
USPC ......... 257/678, 679, 737–738, 781, 784, 786; 235/375, 383; 340/572.1, 572.2
See application file for complete search history.

(56) References Cited

U.S. PATENT DOCUMENTS

| | | | | |
|---|---|---|---|---|
| 5,790,377 A | * | 8/1998 | Schreiber et al. | 361/704 |
| 2006/0027936 A1 | * | 2/2006 | Mizukoshi et al. | 257/781 |
| 2008/0040913 A1 | * | 2/2008 | Baba | 29/601 |
| 2012/0176226 A1 | * | 7/2012 | MacKenzie et al. | 340/10.1 |

* cited by examiner

Primary Examiner — Hoa B Trinh
(74) Attorney, Agent, or Firm — Turk IP Law, LLC

(57) ABSTRACT

Radio Frequency Identification (RFID) tags are provided, along with apparatuses and methods for making. In some embodiments, the RFID tags include an RFID tag chip that is attached to an inlay and/or a strap. The inlay or strap has one or more contact bumps formed thereon. In some of these embodiments, the RFID tag chip includes pads for electrical contacts, but not chip-bumps, thanks to the contact bump.

14 Claims, 13 Drawing Sheets

RFID TAG CHIP ATTACHED TO STRAP

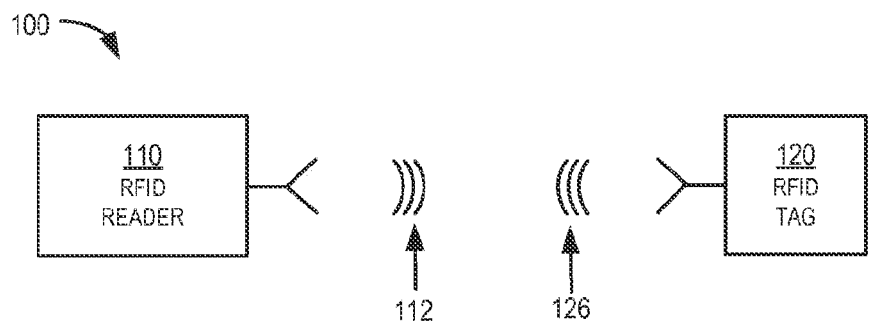
FIG. 1 *RFID SYSTEM*
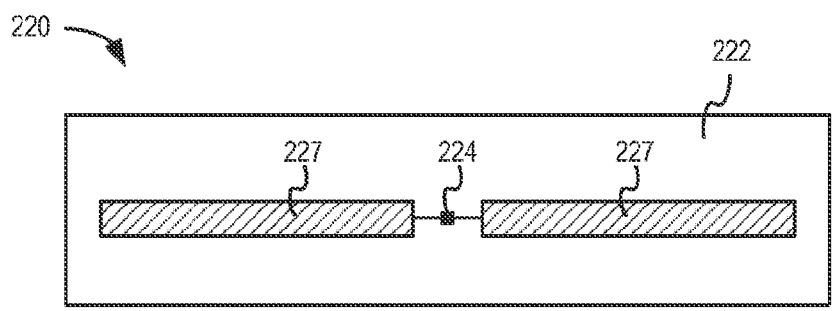
FIG. 2 *RFID TAG*

BUMPED RFID CHIP CONTACTS ANTENNA ELEMENT

*COMPONENTS FOR RFID TAG*

*RFID TAG MANUFACTURING METHOD*

*RFID TAG CHIP ATTACHED TO INLAY*

*RFID TAG CHIP ATTACHED TO STRAP*

BUMPED RFID CHIP CONTACTS BUMPS

RFID CHIP CONTACTS EMBOSSED BUMPS

*RFID CHIP CAPACITIVELY COUPLED TO BUMP*

*RFID CHIP CAPACITIVELY COUPLED TO BUMP*

*ANTENNA ELEMENT IS SEGMENT OF THE ANTENNA*

*ANTENNA ELEMENT IS TRACE CONNECTED TO REMAINDER OF THE ANTENNA*

*APPARATUS - RECEIVING SUBSTRATE*

*APPARATUS - EMBOSSING THE SUBSTRATE*

SUBSTRATE EMBOSSING APPARATUS

*RFID TAG MANUFACTURING METHOD*

RFID TAGS WITH BUMPED SUBSTRATE, AND APPARATUSES AND METHODS FOR MAKING

CLAIM TO PRIORITY

This application is a Non-Provisional of U.S. Provisional Application Ser. No. 60/997,493 filed on Oct. 3, 2007, and a Continuation of U.S. application Ser. No. 12/238,349 filed on Sep. 25, 2008. The disclosure of the parent application is hereby incorporated by reference for all purposes.

BACKGROUND

Radio Frequency IDentification (RFID) systems typically include RFID tags and RFID readers. RED readers are also known as RFID reader/writers RFID interrogators. RFID systems can be used in many ways for locating and identifying objects to which the tags are attached. RFID systems are particularly useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating, RF wave responds by transmitting back another RF wave. The tag generates the transmitted back RF wave either originally, or by reflecting back a portion of the interrogating RF wave in a process known as backscatter. Backscatter may take place in a number of ways.

The reflected-back RF wave may further encode data stored internally in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader reads a tag code, data can be learned about the associated item that hosts the tag, and/or about the tag itself.

An RFID tag typically includes an antenna system, a radio section, a power management section, and frequently a logical section, a memory, or both. In earlier RFID tags, the power management section included an energy storage device, such as a battery. RFID tags with an energy storage device are known as active or semi-active tags. Advances in semiconductor technology have miniaturized the electronics so much that an RFID tag can be powered solely by the RF signal it receives. Such RFID tags do not include an energy storage device, and are called passive tags.

BRIEF DESCRIPTION OF THE DRAWINGS

The following Detailed Description proceeds with reference to the accompanying Drawings.

FIG. 1 is a block diagram of components of an RFID system according to embodiments.

FIG. 2 is a diagram showing components of a passive RFID tag, such as a tag that can be used in the system of FIG. 1.

10A, 10B, 10C are snapshots of successive positions of an embossing apparatus according to an embodiment, to illustrate its operation.

Figure 11:
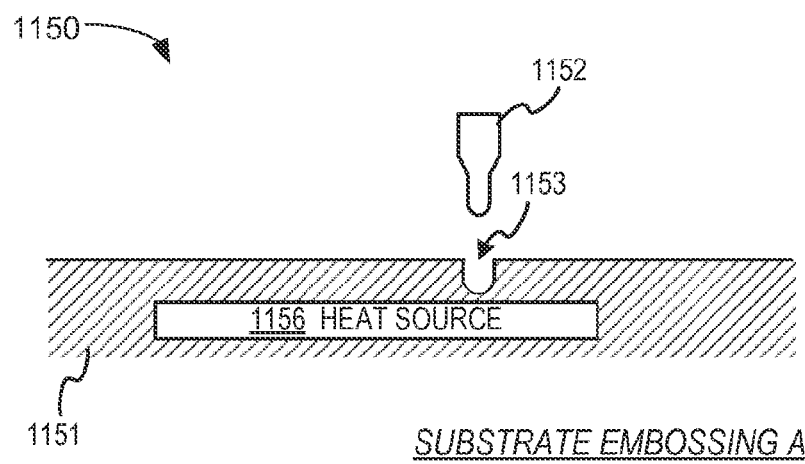

FIG. 11 is a conceptual view of an embossing apparatus with a heat source according to an embodiment.

Figure 12:
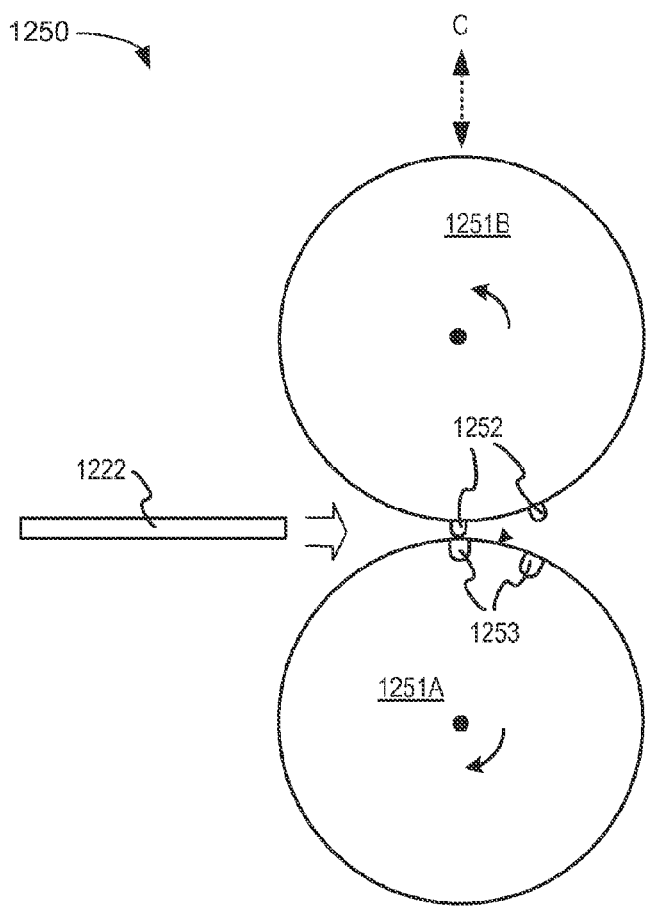

FIG. 12 is a conceptual view of an embossing apparatus according to another embodiment.

Figure 13:
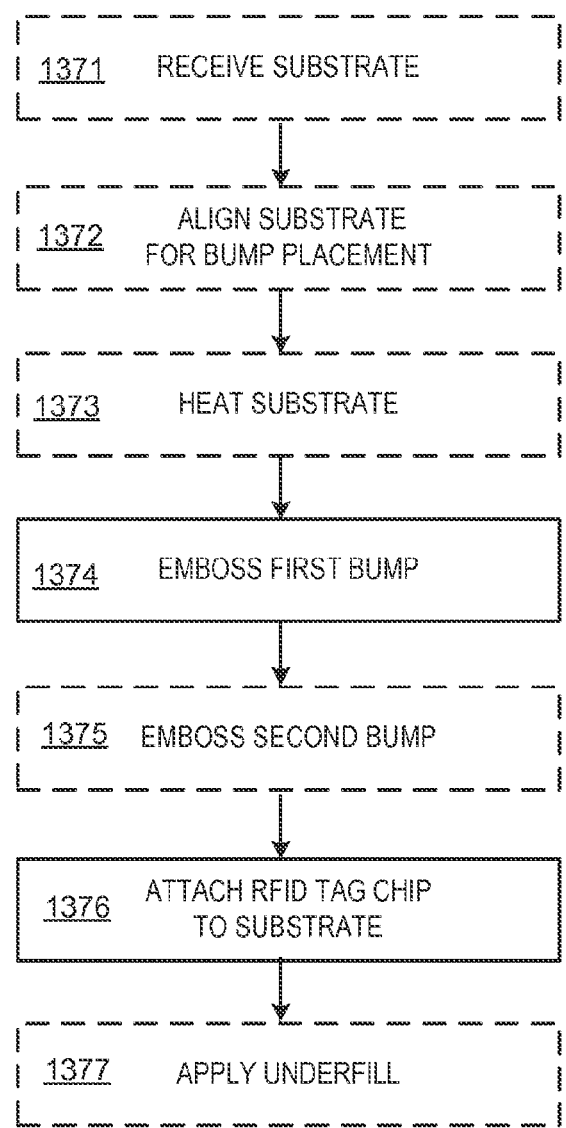

FIG. 13 is a flowchart illustrating an RFID tag manufacturing method according to embodiments of the invention.

DETAILED DESCRIPTION

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment, an entirely firmware embodiment, or an embodiment combining aspects of the above.

As it has been mentioned, the present invention provides for RFID tag manufacturing apparatus and methods. The invention is now described in more detail.

FIG. 1 is a diagram of components of a typical RFID system 100, incorporating aspects of the invention. An RFID reader 110 transmits an interrogating Radio Frequency (RF) wave 112. RFID tag 120 in the vicinity of RFID reader 110 may sense interrogating RF wave 112, and generate wave 126 in response. RFID reader 110 senses and interprets wave 126.

Reader 110 and tag 120 exchange data via wave 112 and wave 126. In a session of such an exchange each encodes, modulates, and transmits data to the other, and each receives, demodulates, and decodes data from the other. The data is modulated onto, and demodulated from, RF waveforms.

Encoding the data in waveforms can be performed in a number of different ways. For example, protocols are devised to communicate in terms of symbols, also called RFID symbols. A symbol for communicating can be a delimiter, a calibration symbol, and so on. Further symbols can be implemented for ultimately exchanging, binary data, such as "0" and "1", if that is desired. In turn, when the waveforms are processed internally by reader 110 and tag 120, they can be equivalently considered and treated as numbers having corresponding values, and so on.

Tag 120 can be a passive tag or an active or semi-active tag, i.e. having its own power source. Where tag 120 is a passive tag, it is powered from wave 112.

FIG. 2 is a diagram of an RFID tag 220, which can be the same as tag 220 of FIG. 2. Tag 220 is implemented as a passive tag, meaning it does not have its own power source. Much of what is described in this document, however, applies also to active tags also.

Tag 220 is formed on a substantially planar inlay 222, which can be made in many ways known in the art. Tag 220 includes an electrical circuit, which is preferably implemented in an integrated circuit (IC), the IC is referred to in this document as RFD tag chip 224. The RFID tag chip is arranged on inlay 222.

In some embodiments in order to interconnect the relatively small RFID tag chip with antennas an intermediate structure (not shown) may be used in the RFID inlays. These structures are variously called "interposers", "straps", and "carriers" to facilitate inlay manufacturing. Interposers include conductive leads or pads that are electrically coupled to the contact pads of RFID tag chip 224 for connecting to an antenna.

Tag 220 also includes an antenna for exchanging wireless signals with its environment. The antenna is usually flat and attached to inlay 222, RFID tag chip 224 is electrically coupled to the antenna via suitable antenna ports (not shown in FIG. 2).

The antenna may be made in a number of ways, as is well known in the art. The antenna pattern is formed from a conductive material. In the example of FIG. 2, the antenna is made from two distinct antenna segments 227, which are shown here forming a dipole. Many other embodiments are possible, using any number of antenna segments.

In some embodiments, an antenna can be made with even a single segment. Different points of the segment can be coupled to one or more of the antenna ports of RFID tag chip 224. For example, the antenna can form a single loop, with its ends coupled to the ports. It should be remembered that, when the single segment has more complex shapes, even a single segment could behave like multiple segments at the frequencies of RFID wireless communication.

In operation, a signal is received by the antenna, and communicated to the RFID tag chip. The RFID tag chip both harvests power, and responds if appropriate, based on the incoming signal and its internal state. In order to respond by replying, the RFID tag chip modulates the reflectance of the antenna, which generates the backscatter from a wave transmitted by the reader. Coupling together and uncoupling the antenna ports of the RFID tag chip can modulate the reflectance, as can a variety of other means.

In the embodiment of FIG. 2, antenna segments 227 are separate from RFID tag chip 224. In other embodiments, antenna segments may alternately be formed on RFID tag chip 224, and so on.

Figure 3:
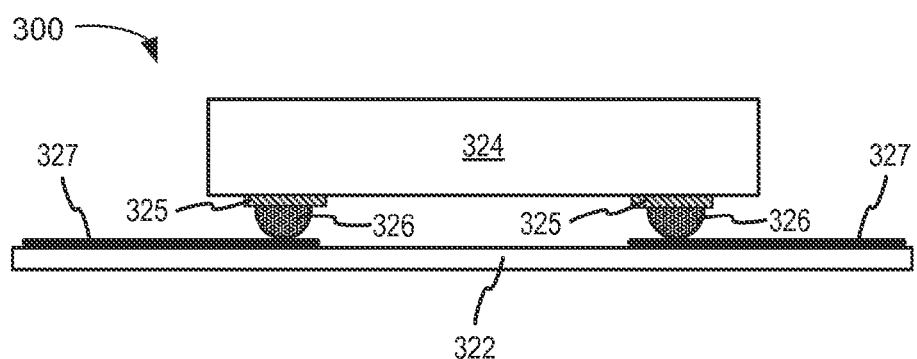
FIG. 3 is a section view showing how a bumped RFID tag chip can contact an antenna element in a tag made according to prior art.

FIG. 3 is section view 300 that shows how a bumped RFID tag chip 324 contacts an antenna element according to the prior art. RFID tag chip 324 is called bumped because it includes electrically conductive chip-bumps 326 attached to electrically conductive pads 325. Chip-bumps 326 are electrically connected to a circuit in RFID tag chip 324. They can be made from a number of materials, such as gold, nickel gold, solder, etc., and be called accordingly gold bumps, nickel gold bumps, solder bumps, etc.

RFID tag chip 324 is affixed to a substrate 322 via chip-bumps 326. Substrate 322 can be a strap or an inlay. In the embodiment of FIG. 3, substrate 322 is an inlay, which has formed thereon two antenna elements 327. Chip-bumps 326 are connected to one or more antenna elements 327. This way, a signal that is received wirelessly via antenna elements 327 is guided to RFID tag chip 324.

In embodiments where substrate 322 is a strap, there would also be an inlay with the antenna elements thereon. Plus, there would be further electrical connections between chip-bumps 326 and the antenna elements.

Figure 4A:
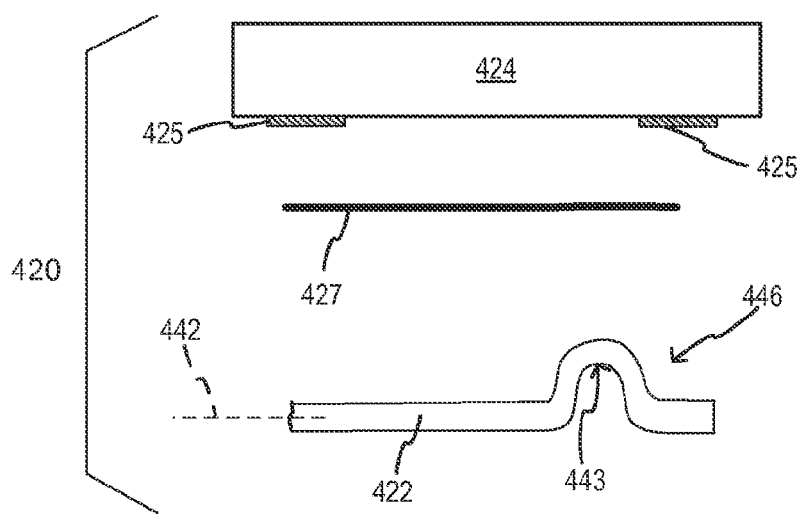
FIG. 4A is a diagram showing some components for making an RFID tag according to embodiments.

FIG. 4A is a diagram showing some components 420 for making an RFID tag according to embodiments. It will be understood that components 420, as shown, are not assembled into a final tag, but are discussed individually. An economy is thus achieved in the present document, as individual assemblies embodying the invention will be described later in this document. It is further understood that components 420 may or may not be all the components needed for constructing a final RFID tag.

Components 420 include an RFID tag chip 424. RFD tag chip 424 has one or more pads 425. RFID tag chip 424 may or may not be bumped. Embodiments where there is no bumping are advantageous, because it will cost less to manufacture RFD tag chip 424.

Components 420 also include a substrate 422. In some embodiments, substrate 422 is an inlay. In other embodiments substrate 422 is a strap or carrier, intended for further attachment to an inlay. Substrate 422 is called substantially planar, in that it can be considered lying along a plane 442. If it is flexible, it can be manipulated to lie flat along plane 442. Substrate 422 can be made from any suitable material to preserve the embossing. One such example is a thermoplastic material, especially where a heat source will be involved.

Substrate 422 has formed on it at least one pump 443, at a portion 446. The bump can be made as described later in this document. Bump 443 is raised from plane 442. Bump 443 is called a contact bump, because it is intended to contact RFID tag chip 424. As will be seen, substrate 422 can have additional bumps, for the same or different purposes.

Components 420 also include an antenna element 427. The nature of antenna element 427 and its relationship to the whole RFID tag is described in more detail later in this document. Antenna element 427 can advantageously be formed on an inlay of the eventual RFID tag, whether the inlay is substrate 422, or not. Antenna element 427 is electrically coupled to the pad. Coupling can be accomplished in many different ways, as will be described later in this document.

Figure 4B:
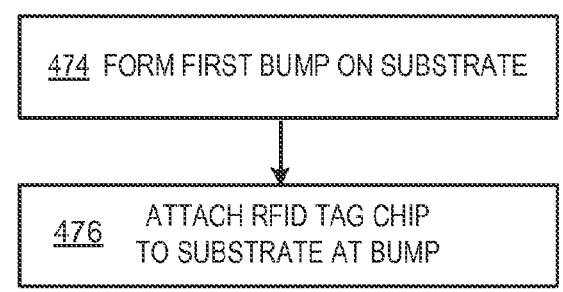
FIG. 4B is a flowchart for illustrating a method for assembling an tag according to embodiments, for example using the components of FIG. 4A.

FIG. 4B is a flowchart 470 for illustrating a method for assembling an RFID tag according to embodiments, for example using the components of FIG. 4A. Flowchart 470 does not show all the required operations. More operations are described later in this document, explicitly or implicitly. The operations of flowchart 470 can be performed in many different ways. Some such ways are described later in this document.

According to an operation 474, a bump is formed on a substrate, which can be substrate 422. The bump can be raised from a plane of the substrate, as bump 443 is raised from plane 442. The hump can be called a contact bump for reasons described above for bump 443.

According to an operation 476, an RFID tag chip is attached to the substrate such that it contacts the bump. The RFID tag chip can be the same as RFID tag chip 424, or different. Attaching can be performed in any number of ways. In some embodiments, the RFID tag chip contacts the bump directly, for example with a proper adhesive, and so on. In some embodiments, the first contact bump has a layer on it, and the RFID tag chip contacts the hump via the layer. The layer can be conductive, as will be seen later on, or be a dielectric, etc. Or, the adhesive can be considered such a layer, etc.

According to the method, a pad of the RFID tag chip becomes electrically coupled to an antenna element. The antenna element can be the same as antenna element 427, or different. Coupling can be conductive or capacitive, and can be performed in any number of ways, as will be appreciated from the further description. In some embodiments, coupling is inherent to the above described attachment. In other embodiments, additional operations are undertaken to effectuate the coupling.

Figure 5A:
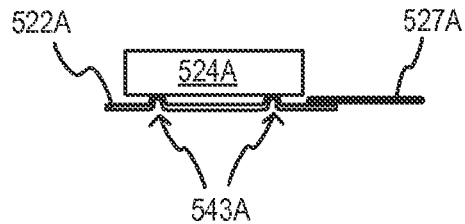
FIG. 5A is a diagram for showing a basic relationship of how the components of FIG. 4A can be arranged, according to an embodiment where the substrate is an inlay.

FIG. 5A is a diagram for showing a basic relationship 521A of how the components of FIG. 4A can be arranged. In relationship 521A, a substrate 522A is an inlay that has two raised contact bumps 543A. An RFID tag chip 524A is on contact bumps 543A. An antenna element 527A is on inlay 522A, and coupled with RFID tag chip 524A via its pads, which are not shown. There are a number of ways for this coupling, which are described later in this document.

Figure 5B:
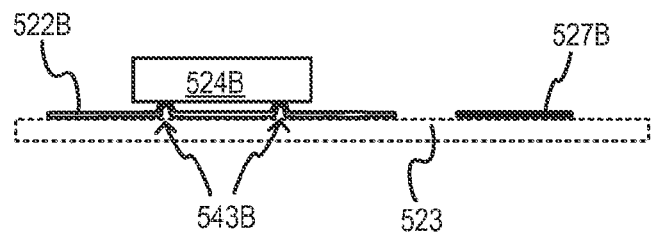
FIG. 5B is a diagram for showing a basic relationship of how the components of FIG. 4A can be arranged, according to an embodiment where the substrate is a strap for placement on an inlay.

FIG. 5B is a diagram for showing a basic relationship 521B of how the components of FIG. 4A can be arranged. In relationship 521B, a substrate 522B is a strap, which is provided on an inlay 523. Substrate 522B has two raised contact bumps 543B. An RFID tag chip 524B is on contact bumps 543B. An antenna element 527B is on inlay 523, and coupled with RFID tag chip 524B via its pads, which are not shown. There are a number of ways for this coupling, which are described later in this document.

More particular embodiments of the invention are now described. The components referred to below can be as was described above. In some embodiments, the one or more contact bumps become directly electrically connected with respective circuit pads. Two examples are now described.

FIG. 64 shows an RFID tag 620A made according to an embodiment. A humped RFID tag chip 624A has pads 625A, and chip-bumps 626A. A substrate 622A has contact bumps 643A. Antenna elements 627A are formed onto bumps 643A. REED tag chip 624A has been attached to substrate 622A such that chip-humps 626A contact bumps 643A. This embodiment achieves a large separation between the remainder of antenna element 627A and the remainder of the circuit of RFID tag chip 624A, as is desired. Still, this embodiment requires that RFID tag chip 624A be bumped.

Figure 6A:
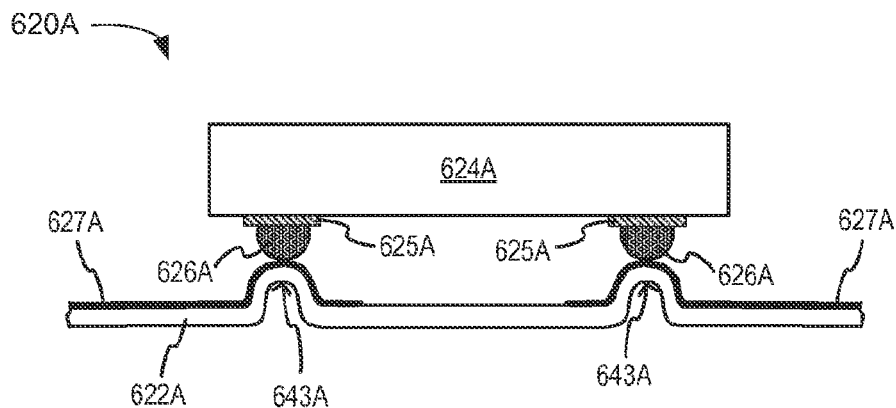
FIG. 6A is a section view showing an RFID tag made according to an embodiment where a bumped RFID tag chip is used.
Figure 6B:
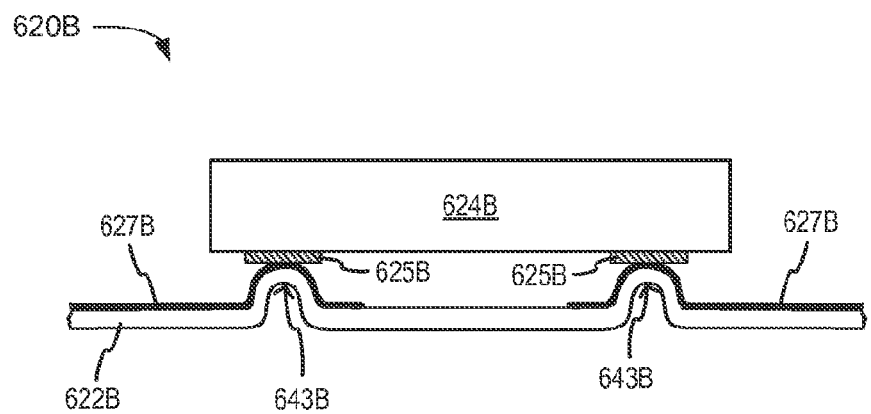
FIG. 6B is a section view showing an RFID tag made according to an embodiment where an RFID tag chip advantageously does not need to be bumped.

FIG. 6B shows an RFID tag 620B made according to an embodiment. An RFID tag chip 624B has pads 625B, but no chip-bumps. A substrate 622B has contact bumps 643B. Antenna elements 627B are formed onto bumps 643B. RFID tag chip 624B has been attached to substrate 622B such that pads 625B contact bumps 643B. This embodiment can achieve a satisfactory separation between the remainder of antenna element 627B and the remainder of the circuit of RFID tag chip 624B, as is desired. Plus, this embodiment advantageously does not require that RFID tag chip 624B be bumped, which is more economical.

In some embodiments, the one or more contact bumps become capacitively coupled with respective circuit pads. This can be performed as a result of the shapes and the attaching. Two examples are now described.

Figure 6C:
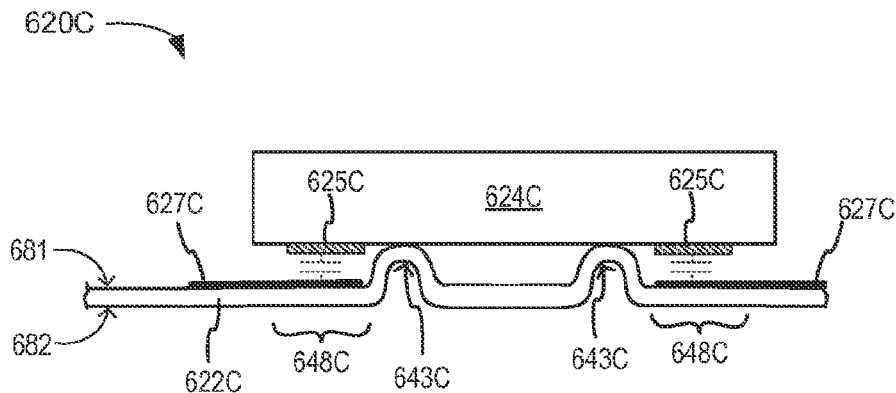
FIG. 6C is a section view showing an RFID tag made according to another embodiment where an RFID tag chip advantageously does not need to be bumped, and contact bumps of the substrate are used as spacers.

FIG. 6C shows an RFID tag 620C made according to an embodiment. An RFID tag chip 624C has pads 625C, but no chip-bumps. A substrate 622C has a top surface 681 and a bottom surface 682 that is opposite to top surface 681. Substrate 622C has contact bumps 643C, which will be used as spacers. Antenna elements 627C are formed on top surface 681 of substrate 622C, reaching regions 648C, but not contact bumps 643C. RFID tag chip 624C has been attached to substrate 622C at top surface 681 such that RFID tag chip 624C contacts contact bumps 643C. However, pads 625C are only capacitively coupled with antenna elements 627C, without making a direct connection. More particularly, pads 625C are only capacitively coupled with regions 648C. Contact bumps 643C act as spacers that prevent antenna element 627C from contacting pads 625C. This embodiment can achieve a satisfactory separation between the remainder of antenna element 627C and the remainder of the circuit of RFID tag chip 624C, as is desired. Plus, this embodiment advantageously does not require that RFID tag chip 624C be bumped, which is more economical. In addition, in this embodiment attaching will be easier, because the adhesion is not metal to metal at the top of bumps 643C.

Figure 6D:
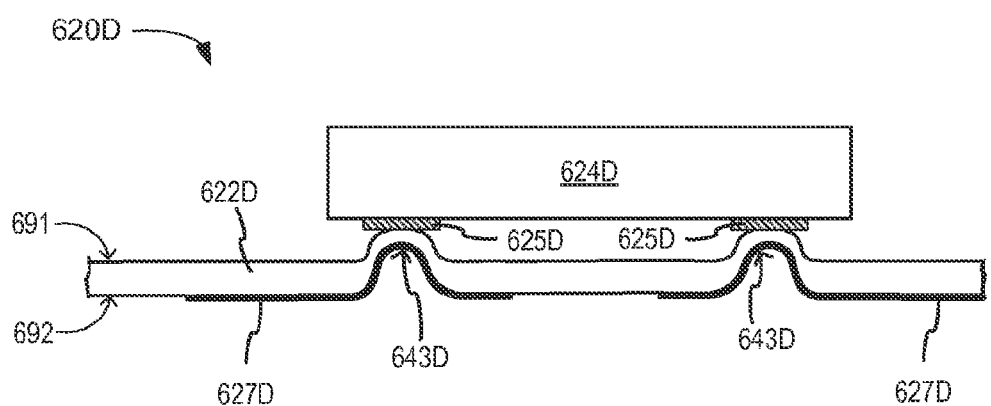
FIG. 6D is a section view showing an RFID tag made according to one more embodiment.

FIG. 6D shows an RFID tag 620D made according to one more embodiment. An RFID tag chip 624D has pads 625D, but no chip-bumps. A substrate 622D has a top surface 691 and a bottom surface 692 that is opposite to top surface 691. Substrate 622I) has contact bumps 643D, which will be used as spacers. Antenna elements 627D are formed on bottom surface 692 of substrate 622D, reaching the inside of humps 643D, RFID tag chip 624D has been attached to substrate 622D at top surface 681 such that RFID tag chip 624D contacts contact bumps 643D. However, pads 625D are only capacitively coupled with antenna elements 627D, without making a direct connection, through substrate 622D. Contact bumps 643D act as spacers that further remove the remainder of antenna element 627D from the remainder of RFID tag circuit 624D to achieve a satisfactory separation. Plus, this embodiment advantageously does not require that RFID tag chip 624D be bumped, which is more economical. In addition, in this embodiment attaching will be easier, because the adhesion is not metal to metal at the top of bumps 643D.

In all of these examples, the RFID tag chip can be placed in any suitable way. Some such ways include using a pick and place machine. Attachment can be realized by many processes, such as application of anisotropic conductive paste, direct ultrasonic bonding, welding, etc.

The nature of the antenna elements of the invention, and their relationship to the antenna of the whole RFID tag, are now described in more detail. Two examples are given, where the contact bumps are electrically connected with the pads. In addition, the antenna elements include conductive traces on the substrate at the contact bumps, such as is shown in 6A and 6B.

Figure 7A:
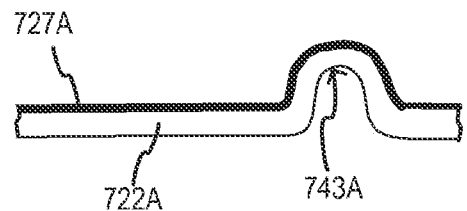
FIG. 7A is a diagram for illustrating that an antenna element can be a conductive trace that is formed continuously with the remainder of an antenna of the RFID tag according to embodiments.

FIG. 7A is a diagram 749A according to an embodiment. A substrate 722A has a bump 743A. An antenna element 727A includes a conductive trace on the substrate at the first contact bump. The conductive trace is formed continuously with a remainder of an antenna of the RFID tag, extending much beyond the bump. An advantage is that at least a portion of antenna element 727A can be manufactured by a single process, before or after bump 743A is formed in substrate 722A.

Figure 7B:
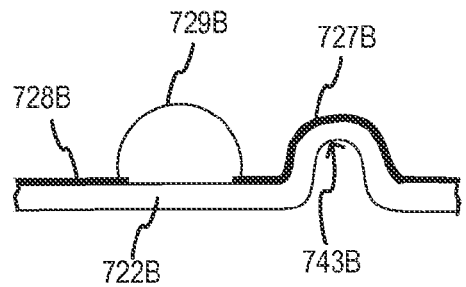
FIG. 7B is a diagram for illustrating that an antenna element can be a conductive trace that is separately connected to the remainder of the antenna of the RFID tag, according to embodiments.

FIG. 7B is a diagram 749B according to an embodiment. A substrate 722B has a bump 743B. An antenna element includes a conductive trace 727B on the substrate at contact bump 743B. The remainder 728B of the antenna of the RFID tag is connected with conductive trace 727B via a different conductor 729B. An advantage is that better focus can be given in manufacturing conductive trace 727B on top of bump 743B.

These examples are not limiting. Parallel embodiments would be for embodiments where the contact bumps are only capacitively coupled with the pads.

Bumps can be formed in the substrate in various shapes. Various methods and machines for forming the bumps are described later in this document. Forming the bumps is sometimes also called embossing.

The dimensions of bumps can be as needed for the final assembly, for example also considering the size of the RFID tag chip. In addition, the material properties of the substrate of the embossing, and for the substrate to retain the shape should also be considered. A height that can work well for contact bumps can be 15 µm to 20 µm. Moreover, for a bump that is round, a sample diameter is 40 µm. Other dimensions can work as well.

Figure 8A:
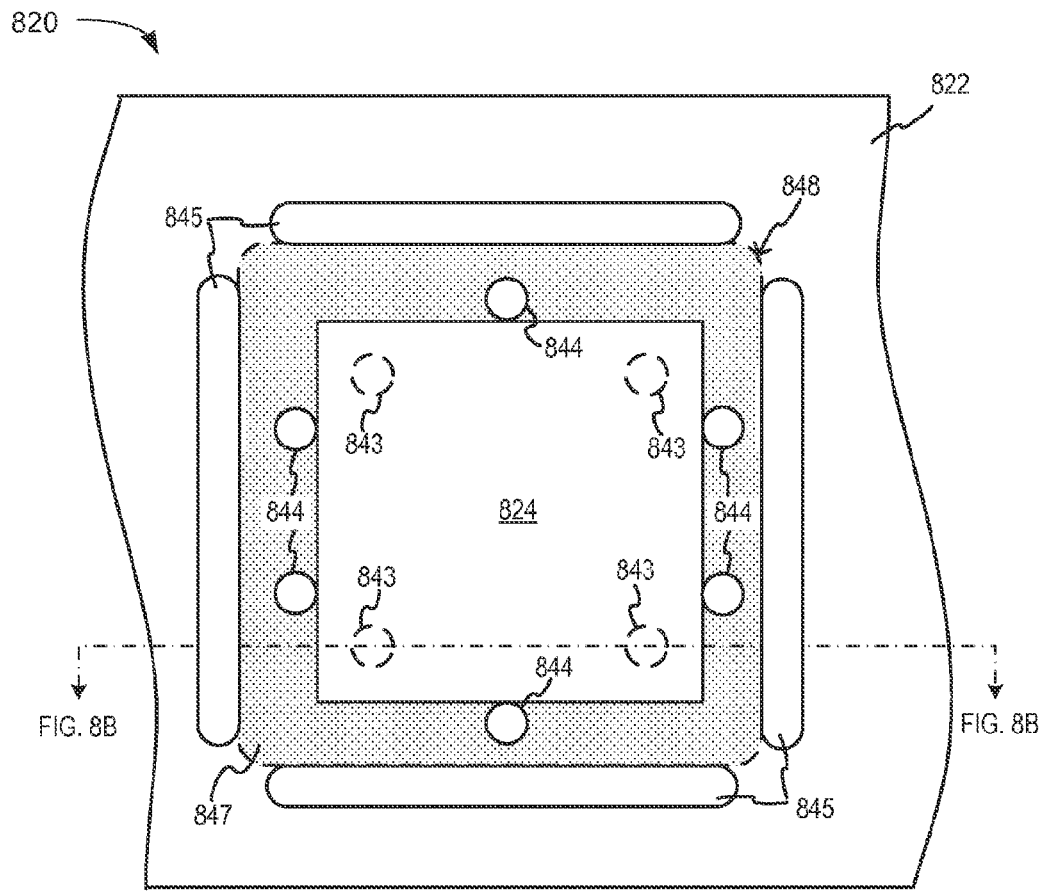
FIG. 8A is a top view of a portion of an RFID tag according to a sample embodiment.
Figure 8B:
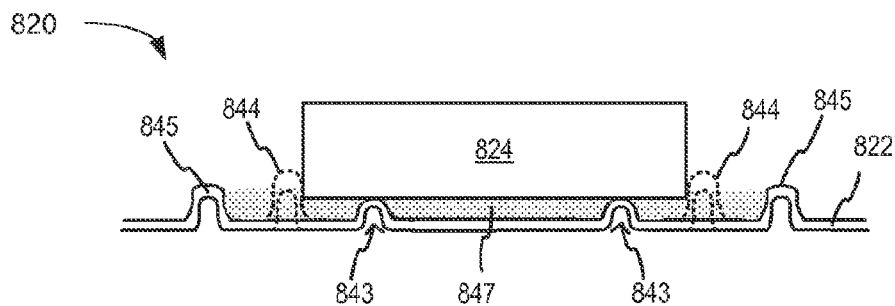
FIG. 8B is a section view of the portion of FIG. 8A.

FIG. 8A is a top view of a portion 820 of an RFID tag according to a sample embodiment. FIG. 8B is a section view of portion 820, along a line of FIG. 8A.

Referring first to FIG. 8A, portion 820 is on a substrate 822, which can be an inlay or a strap as per the above. Substrate 822 has four contact bumps 843, on top of which there is an RFID tag chip 824. Pads of RFID tag chip 824 are not shown, along with corresponding antenna elements near or on contact bumps 843. Those, if provided, might be aligned vertically in FIG. 8A away from contact bumps 843, so as to interfere minimally with the other features.

Examples have been given above where the bumps in the substrate are contact bumps. Bumps can be used advantageously in the invention for additional purposes. Two additional such purposes are now described, referring now also to FIG. 8B, together with FIG. 8A.

A first such purpose can be for alignment. Bumps can be formed on the substrate for aligning the RFID tag chip on the substrate, before the attachment. Such can be called alignment bumps. Sample alignment bumps 844 are shown for portion 820. RFID tag chip 824 can be brought to alignment with contact bumps 843 by way of the chip being first brought to contact with alignment bumps 844. If more than one alignment bumps are formed, together they can form an alignment pocket for chip 824. Alignment bumps will improve the process, because they will improve the tolerance of placing chip 824 at exactly the intended location of substrate 822.

Alignment bumps 844 preferably lave a larger bump-height than contact bumps 843. A good difference is 15-20 µm.

In some embodiments, underfill 847 is applied between substrate 822 and RIM tag chip 824. Preferably, the underfill surrounds contact bumps 843. Application of the underfill material can make RFID tag 820 stronger and more robust.

A second purpose for bumping the substrate can be for containing the underfill. In this example, raised containment bumps 845 are also formed on substrate 822 for containing underfill 847. Containment bumps 845 can be in any desirable shape. Preferably they are elongated as shown, for example to form a tub 848. Tub 848 can be 5 µm away from each side of RFID tag chip 824. Containment need not be absolute. For example tub 848 but might be leaky between adjacent containment bumps 845.

The invention also includes methods and apparatuses for manufacturing RFID tags, such as the RFID tags described above. General features of the inventive aspects of these apparatuses are now described, to complement what is already known about such apparatuses. In addition, some of the description that follows is to be understood with what has already been described. Examples are now described.

Figure 9:
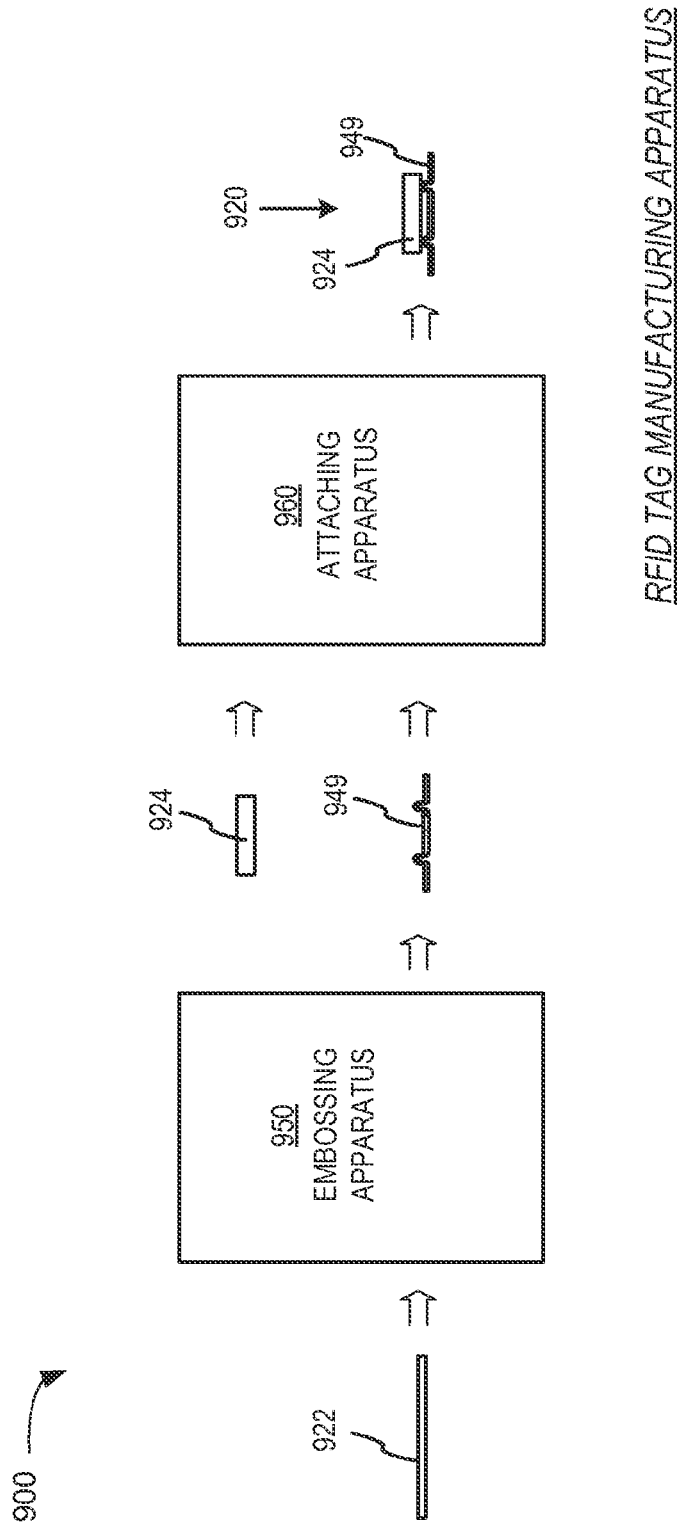
FIG. 9 is a high-level block diagram of a part of an RFID tag manufacturing apparatus according to embodiments.

FIG. 9 is a high-level block diagram of a part of an RFID tag manufacturing apparatus 900 according to embodiments. RFID tag manufacturing apparatus 900 includes embossing apparatus 950 and attaching apparatus 960.

Embossing apparatus 950 can be used to emboss substrates such as inlays or straps. Embossing apparatus 950 receives un-embossed substrate 922. The embossing process transforms substrate 922 to embossed substrate 949, which has formed on it one or more raised bumps. The bumps are for the purposes described above.

Attaching apparatus 960 forms RFID tag 920 from substrate 949 and an RED tag chip 924. Attaching apparatus 960 includes a machine that attaches an RFID tag chip 924 to embossed substrate 949. Attachment is such that the RFD tag chip contacts one of the bumps, which is called a contact bump.

Embossing apparatuses can be made in any number of ways. They can be for either forming multiple bumps concurrently to the substrate, or for forming a single bump. If for a single bump, in some embodiments they can be used a number of times, to emboss multiple bumps in a single substrate. In general, an embossing apparatus according to the invention can include a work support member that has a surface for receiving the substrate. In addition, a protruding member can press a portion of the substrate against a bumping-pattern. The bumping-pattern includes a depression to receive matingly the protruding member. This pressing forms the bump on the portion. In some embodiments, the protruding member protrudes from the surface, and the bumping-pattern is formed elsewhere. In other embodiments, the bumping-pattern is a depression in the surface. Some examples are now described in more detail.

10A, 10B, 10C are snapshots of successive positions of an embossing apparatus 1050 according to an embodiment, to illustrate its operation. Apparatus 1050 receives a substrate 1022 for embossing.

Figure 10A:
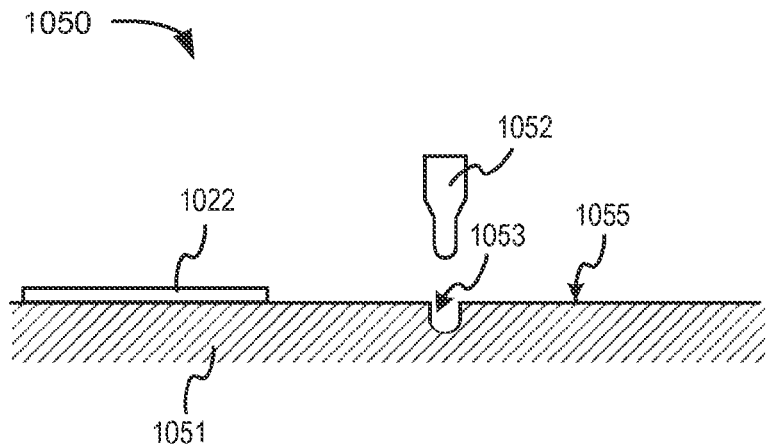

As seen in FIG. 10A, embossing apparatus 1050 includes a work support member 1051. Work support member 1051 has a substantially flat surface 1055 on which to receive a substrate 1022. A bumping-pattern 1053 is disposed on surface 1055. Bumping-pattern 1053 includes one or more depressions.

Embossing apparatus 1050 also includes a protruding member 1052. Bumping-pattern 1053 can receive protruding member 1052 matingly. Bumping-pattern 1053, along with protruding member 1052, defines the size and location of features that will be embossed in substrate 1022.

Figure 10B:
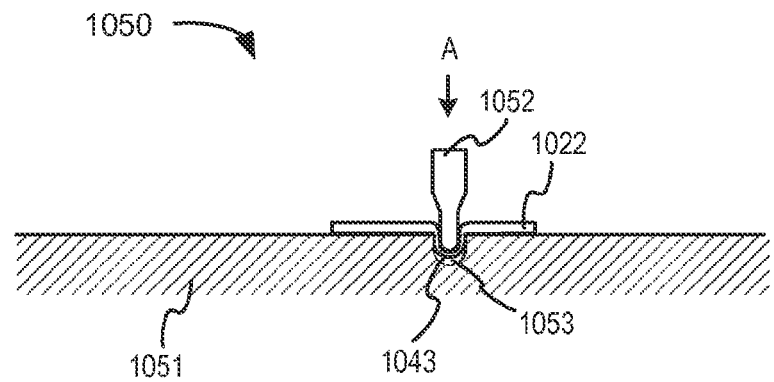

As seen in FIG. 10B, substrate 1022 is moved over bumping-pattern 1053. Such moving can be performed by a feeder means (not shown). Protruding member 1052 moves in the direction of arrow A. This presses a portion of substrate 1022 against bumping-pattern 1053. Pressing forms bump 1043 on substrate 1022.

Figure 10C:
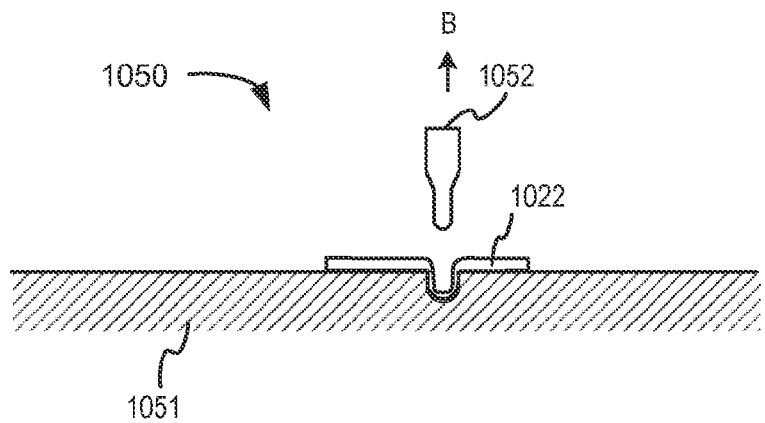

As seen in FIG. 10C, protruding member 1052 moves back in the direction of arrow B. This releases embossed substrate 1022.

One or more bumps may be formed simultaneously or successively. If bump 1043 is to include a conductive trace, the latter can be applied either before or after the embossing.

FIG. 11 is a conceptual view of an embossing apparatus 1150 according to an embodiment, which is an extension of the embodiment of FIGS. 10A, 10B, 10C. Embossing apparatus 1150 includes a work support member 1151, a protruding member 1152, and a bumping-pattern 1153 that can receive matingly protruding member 1152.

In addition, embossing apparatus 1150 includes a heat source 1156 for heating a substrate (not shown). Heat source 1156 can be made in many ways, such as by a conductive heat source, etc. Heat source 1156 can be part of work support member 1151, or it can be implemented as a radiating heat source (not shown) separate from support member 1151. Heat source 1156 is employed to elevate the temperature of a substrate in conjunction with the embossing operation. Heating a thermoplastic substrate will soften it, which reduces the required pressure to perform the embossing operation. The lower pressure induces less stress in the substrate. In addition, heat may be used for the substrate to retain its bumped shape.

FIG. 12 is a conceptual view of an embossing apparatus 1250 according to another embodiment. Embossing apparatus 1250 includes two rotating wheels 1251A, 1251B. Both of these have curved surfaces for receiving a substrate 1222. Embossing wheels 1251A and 1251B are spaced apart sufficiently to allow substrate 1222 to pass through. Once substrate 1222 is fed between the embossing wheels, it can be moved by them. The surface of one of these wheels, here that of 1251A, includes a bumping pattern 1253. The surface of the other of these wheels, here that of 1251B, includes a protrusion 1252 that is received matingly in humping pattern 1253. The surfaces can have additional features, etc.

Other embodiments are also possible. For example, a hybrid embossing apparatus can be made with surface 1051 of FIG. 10A being moved, and protrusion 1252 being carried by a wheel such as wheel 1251B.

FIG. 13 is a flowchart that illustrates manufacturing methods 1300 of RFID tag according to embodiments. Methods of 1300 may be practiced by different embodiments, including but not limited to the apparatuses described above.

At an optional operation 1371, a substantially planar substrate is received.

At an optional next operation 1372, the substrate is aligned to an embossing pattern for correct bump placement. Placement accuracy can be 20 μm or less.

At an optional next operation 1373, the substrate is heated. If it is made from thermoplastic material, a good range for the temperature is 75-100° C.

At a next operation 1374, a contact bump is embossed, as per the above.

At a next operation 1375, an additional bump is embossed, as per the above. In fact, operation 1375 can be repeated for all the desired features to be embossed.

At a next operation 1376, an RFID tag chip is attached to the substrate.

At optional next operation 1377, underfill is applied to fill a cavity between the RFID tag chip and the substrate. The underfill can be cured, etc.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions, and/or properties disclosed herein. The following claims define certain combinations and subcombinations, which are regarded as novel and non-obvious. Additional claims for other combinations and subcombinations of features, functions, elements, and/or properties may be presented in this or a related document.

The invention claimed is:

1. A Radio Frequency Identification (RFID) tag, comprising:
a substantially planar substrate with at least two contacts and at least two alignment bumps, wherein the at least two alignment bumps are raised from a plane of the substrate and do not overlap with the at least two contacts;
an RFID tag chip with at least two pads, the tag chip aligned on the substrate by the alignment bumps such that the pads electrically connect to the contacts; and
an antenna formed on the substrate and electrically connected to the pads.

2. The RFID tag of claim 1, further comprising:
a layer between the pads and the contacts such that an electrical connection is capacitive.

3. The RFID tag of claim 1, in which
the substrate has a top surface and a bottom surface opposite to the top surface,
the tag chip contacts the contacts at the top surface, and
the antenna is attached to the substrate at the bottom surface.

4. The RFID tag of claim 1, in which
the tag chip is secured to the substrate using underfill.

5. The RFID tag of claim 4, in which
the substrate further includes at least one containment bump for containing the underfill.

6. The RFID tag of claim 5, in which
the at least one containment bump is elongated.

7. The RFID tag of claim 1, wherein the at least two alignment bumps are taller than the at least two contacts.

8. The RFID tag of claim 1, wherein the at least two alignment bumps separate a surface of the tag chip from a surface of the substrate.

9. A Radio Frequency Identification (RFID) tag, comprising:
a substantially planar substrate with at least two contacts and at least two alignment bumps raised from a plane of the substrate;
an RFID tag chip with at least two pads, the tag chip aligned on the substrate by the alignment bumps such that the pads electrically connect to the contacts and the alignment bumps are positioned outside a perimeter of the tag chip; and
an antenna formed on the substrate and electrically connected to the pads.

10. The RFID tag of claim 9, further comprising:
a layer between the pads and the contacts such that an electrical connection is capacitive.

11. The RFID tag of claim 9, in which
the substrate has a top surface and a bottom surface opposite to the top surface,
the tag chip contacts the contacts at the top surface, and
the antenna is attached to the substrate at the bottom surface.

12. The RFID tag of claim 9, in which the tag chip is secured to the substrate using underfill.

13. The RFID tag of claim 12, in which the substrate further includes at least one containment bump for containing the underfill.

14. The RFID tag of claim 13, in which the at least one containment bump is elongated.

\* \* \* \* \*

UNITED STATES PATENT AND TRADEMARK OFFICE
CERTIFICATE OF CORRECTION

| | |
|---|---|
| PATENT NO. | : 8,796,865 B1 |
| APPLICATION NO. | : 14/083244 |
| DATED | : August 5, 2014 |
| INVENTOR(S) | : Fassett et al. |

Page 1 of 1

It is certified that error appears in the above-identified patent and that said Letters Patent is hereby corrected as shown below:

In the Specification

In Column 9, Line 38, Delete "bumping pattern" and insert -- bumping-pattern --, therefor.

In Column 9, Line 40, Delete "humping pattern" and insert -- bumping-pattern --, therefor.

Signed and Sealed this
Seventh Day of April, 2015

Michelle K. Lee
*Director of the United States Patent and Trademark Office*